(12) United States Patent
Biber et al.

(10) Patent No.: US 10,481,227 B2
(45) Date of Patent: Nov. 19, 2019

(54) TRANSMISSION OF MAGNETIC RESONANCE SIGNALS BY DIFFERENTIAL CABLE ROUTING

(71) Applicants: Stephan Biber, Erlangen (DE); Jan Bollenbeck, Eggolsheim (DE); Martin Hemmerlein, Bamberg (DE)

(72) Inventors: Stephan Biber, Erlangen (DE); Jan Bollenbeck, Eggolsheim (DE); Martin Hemmerlein, Bamberg (DE)

(73) Assignee: Siemens Healthcare GmbH, Erlangen (DE)

( * ) Notice: Subject to any disclaimer, the term of this patent is extended or adjusted under 35 U.S.C. 154(b) by 261 days.

(21) Appl. No.: 15/585,769

(22) Filed: May 3, 2017

(65) Prior Publication Data
US 2017/0322267 A1 Nov. 9, 2017

(30) Foreign Application Priority Data
May 3, 2016 (EP) .................................. 16168126

(51) Int. Cl.
*G01R 33/36* (2006.01)
*G01R 33/385* (2006.01)
*G01R 33/3815* (2006.01)
*H03H 7/42* (2006.01)

(52) U.S. Cl.
CPC ....... *G01R 33/3621* (2013.01); *G01R 33/385* (2013.01); *G01R 33/3815* (2013.01); *H03H 7/42* (2013.01)

(58) Field of Classification Search
CPC .............. G01R 33/3621; G01R 33/385; G01R 33/3815; H03H 7/42
See application file for complete search history.

(56) References Cited

U.S. PATENT DOCUMENTS

| 5,148,130 | A | 9/1992 | Dietrich | |
| 2006/0103484 | A1 | 5/2006 | Ezzeddine | |
| 2009/0096455 | A1* | 4/2009 | Biber | G01R 33/3415 324/322 |
| 2011/0234229 | A1* | 9/2011 | Biber | G01R 33/3685 324/322 |
| 2014/0347143 | A1* | 11/2014 | Oppelt | H01P 1/18 333/25 |

FOREIGN PATENT DOCUMENTS

| DE | 10104260 C2 | 5/2003 |
| DE | 102013209450 A1 | 11/2014 |
| WO | WO03093851 A1 | 11/2003 |
| WO | WO2012072969 A1 | 6/2012 |

* cited by examiner

*Primary Examiner* — Patrick Assouad
*Assistant Examiner* — Haidong Zhang
(74) *Attorney, Agent, or Firm* — Lempia Summerfield Katz LLC

(57) ABSTRACT

A transmission apparatus for transmitting an intermediate frequency signal and an oscillator signal for mixing down the intermediate frequency signal, a magnetic resonance tomograph with a local coil, a receive unit, and a transmission apparatus are provided. The transmission apparatus has a symmetrical transmission line for transmission of the oscillator signal and the intermediate frequency signal and a symmetrizing element for adaptation of an unsymmetrical signal source and/or signal sink to the symmetrical transmission line. The symmetrizing element has only ferrite-free inductances. The local coil and the receive unit are connected for signaling purposes via the transmission apparatus.

16 Claims, 3 Drawing Sheets

TRANSMISSION OF MAGNETIC RESONANCE SIGNALS BY DIFFERENTIAL CABLE ROUTING

This application claims the benefit of EP 16168126.7, filed on May 3, 2016, which is hereby incorporated by reference in its entirety.

BACKGROUND

The present embodiments relate to transmission of an intermediate frequency signal and an oscillator signal for mixing down the radio-frequency receive signal into an intermediate frequency level.

Magnetic resonance tomographs are imaging apparatuses that, for imaging an examination object, align nuclear spins of the examination object with a strong external magnetic field and excite the nuclear spins by a magnetic alternating field for precession around this alignment. The precession or return of the spins from this excited state into a state with lower energy generates a magnetic alternating field as a response (e.g., a magnetic resonance signal) that will be received via antennas.

With the aid of magnetic gradient fields, a spatial encoding is impressed onto the signals, which subsequently makes it possible to assign the received signal to a volume element. The received signal is then evaluated, and a three-dimensional imaging representation of the examination object is provided.

To excite the precession of the spins, magnetic alternating fields with a frequency that corresponds to the Larmor frequency at the respective static magnetic field strength and very high field strengths or powers are to be provided. To improve the signal-to-noise ratio of the magnetic resonance signal received by the antennas, antennas that are often referred to as local coils and are arranged directly on the patient may be used.

For imaging, the magnetic resonance signals received by the local coil are transmitted to a receive device of the magnetic resonance tomograph. The magnetic resonance signals may also be stepped down by mixing the magnetic resonance signals into a lower frequency range (e.g., intermediate frequency). In order to be able to detect the phase and frequency features of the original magnetic resonance signal during evaluation, the mixing signal or oscillator signal is then likewise to be provided as a reference and is to be transmitted.

The magnetic resonance signal may have a bandwidth of one Megahertz. Once the magnetic resonance signal has been mixed down to an intermediate frequency of, for example, 10 MHz, the intermediate frequency signal consequently involves a relatively wideband signal.

Coaxial cables that, in thin and flexible forms of embodiment, for example, are expensive and difficult to work with may be used for transmission of the signals.

The published patent DE 10104260 A1 discloses a symmetrizing element for two frequencies. The published patent DE 102013209450 A1 describes a symmetrizing element for a widened frequency range.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a transmission apparatus and a magnetic resonance tomograph that are easier to handle and are more cost-effective are provided.

The transmission apparatus is intended for transmission of an intermediate frequency signal and an oscillator signal for creating the intermediate frequency signal. The intermediate frequency signal may therefore be provided in a frequency range that is restricted upwards by a multiple of the magnetic resonance signal bandwidth (e.g., by twice, three times, five times or ten times the magnetic resonance signal bandwidth; is below 2, 5, 10 or 20 MHz). In this case, the oscillator signal is provided in a frequency range around the Larmor frequency plus/minus the intermediate frequency (e.g., above 50 MHz). For example, a transmission apparatus of which the attenuation for the signals to be transmitted is less than 3, 6 or 12 dB may be suitable for transmission.

The transmission apparatus has a symmetrical transmission line for transmission of the oscillator signal and the intermediate frequency signal. A symmetrical transmission line is a transmission line, in which, by contrast with an asymmetrical transmission line, not one conductor of the at least two conductors has a reference or ground potential. In a symmetrical transmission line, both conductors of a conductor pair carry a signal (e.g., with opposite polarity), so the emissions from the transmission lines or radiations into the line cancel each other out. Symmetrical transmission lines are referred to as differential transmission lines. For example, the symmetrical transmission line may involve a line with twisted pairs or a strip line or flat webbed line.

The transmission device has a symmetrizing element (e.g., balanced/unbalanced, "balun") for adapting an unsymmetrical signal source and/or signal sink to the symmetrical transmission line. The symmetrizing element has only ferrite-free inductances. Ferrite-free inductances are, for example, air coils that do not have any ferrite core, such as, for example, a ring core. The transmission apparatus is differentiated in this way from transmission devices that have a wideband symmetrizing element with a ring core transformer as a balun.

The transmission apparatus may be used in an advantageous manner in magnetic resonance apparatuses in an examination area, since no ferrite saturation effects show up and disturb the static and dynamic magnetic fields. In addition, the transmission apparatus is capable of accepting signals from a normal local coil with unsymmetrical signal output and transmitting the signals, even if the signals lie in different frequency ranges for intermediate frequency signals and oscillator signals.

The magnetic resonance tomograph shares the advantages of the transmission apparatus.

In one embodiment of the transmission apparatus, the transmission apparatus is intended for transmission of the oscillator signal with a frequency of greater than 50 MHz and the intermediate frequency signal with a frequency less than 20 MHz. In this case, the bandwidth of the two signals may be less than or equal to 1, 2, or 5 MHz. In one embodiment, the bandwidth of at least the intermediate frequency signal is greater than or equal to 500 kHz or 1 MHz. The transmission apparatus may be suitable for transmitting a frequency range if the attenuation in the frequency ranges to be transmitted is less than 3 dB, 6 dB, or 12 dB.

The transmission apparatus is configured for equally good transmission of signals in two frequency ranges lying far apart from one another, as is to be provided for a magnetic resonance tomograph with intermediate frequency.

In one embodiment of the transmission apparatus, the transmission apparatus exhibits a local attenuation minimum in the range of the frequency of the oscillator signal and in the range of the frequency of the intermediate frequency signal, respectively. A range may be the bandwidth of the respective signal or a multiple thereof (e.g., twice, three times, or five times the bandwidth).

A wideband adaptation of an unsymmetrical signal source to a symmetrical transmission source is barely possible without inductances with ferrites (e.g., ring cores, classical baluns). The transmission apparatus provides an adaptation with low attenuation in predetermined frequency ranges to be provided for the function of the magnetic resonance tomograph.

In an embodiment of the transmission apparatus, the transmission apparatus has a local maximum of the common mode rejection for the frequency range of the oscillator signal and for a frequency range of the intermediate frequency signal. A range of 1, 2, 5 or 10 MHz around the respective signal may be, for example, the frequency range of the oscillator signal or the intermediate frequency signal.

A common mode rejection specifies a measure for suppression of faults that act on both wires of a symmetrical line. A maximum of the common mode rejection in the range of the useful signals reduces above all disturbances irradiated into the line (e.g., common mode faults) and improves image acquisition in this way.

In one embodiment of the transmission apparatus, this has a Boucherot bridge as symmetrizing element. A Boucherot bridge refers to a bridge circuit including at least two Boucherot elements, or a low pass element and a high pass element in each case. The Boucherot bridge converts at a rated frequency an unsymmetrical line system into a symmetrical line system. In addition, the interface impedances may be transformed in a narrowband system by a Boucherot bridge, and power matching may thus be achieved.

At a rated frequency, a Boucherot bridge makes possible an adaptation of radio-frequency signals even without ferrite coils or transformers.

The classical Boucherot bridge has the serious disadvantage that the function is merely able to be used in a single and also relatively narrow frequency band around the rated frequency.

In one embodiment of the transmission apparatus, the Boucherot bridge, in at least one or also in both branches, has two stages. A stage refers to, for example, the respective Boucherot elements (e.g., the high pass and low pass element) that are each arranged in a branch of the Boucherot bridge. In the embodiment, two low pass elements are connected in series in each case in a branch of the Boucherot bridge and/or two high pass elements are connected in series in each case in the other branch of the Boucherot bridge. In this case, the two Boucherot elements connected in series in each case differ in the values of components, so that the two Boucherot elements have different characteristic impedance curves.

The interaction of the two Boucherot elements with a different frequency characteristic in one branch widens the bandwidth of the branch of the Boucherot bridge in an advantageous manner.

In one embodiment of the transmission apparatus, the Boucherot bridge, instead of one or more capacitances, has a parallel oscillating circuit in each case. Alternatively or additionally, instead of one or more inductances, the Boucherot bridge has a series oscillating circuit in each case. In one embodiment, all capacitances of the Boucherot bridge are replaced by parallel oscillating circuits, and all inductances of the Boucherot bridge are replaced by inductances.

The oscillating circuits, through different resonant frequencies, may allow the symmetrizing element to be optimized simultaneously for different frequency ranges.

In one embodiment of the magnetic resonance tomograph, the local coil is connected to the transmission apparatus for signaling via an asymmetrical interface.

The magnetic resonance tomograph, through the symmetrizing element of the transmission apparatus, may use a previously used local coil with a connection for a coaxial cable in conjunction with the low-cost transmission apparatus.

DETAILED DESCRIPTION

Figure 1:
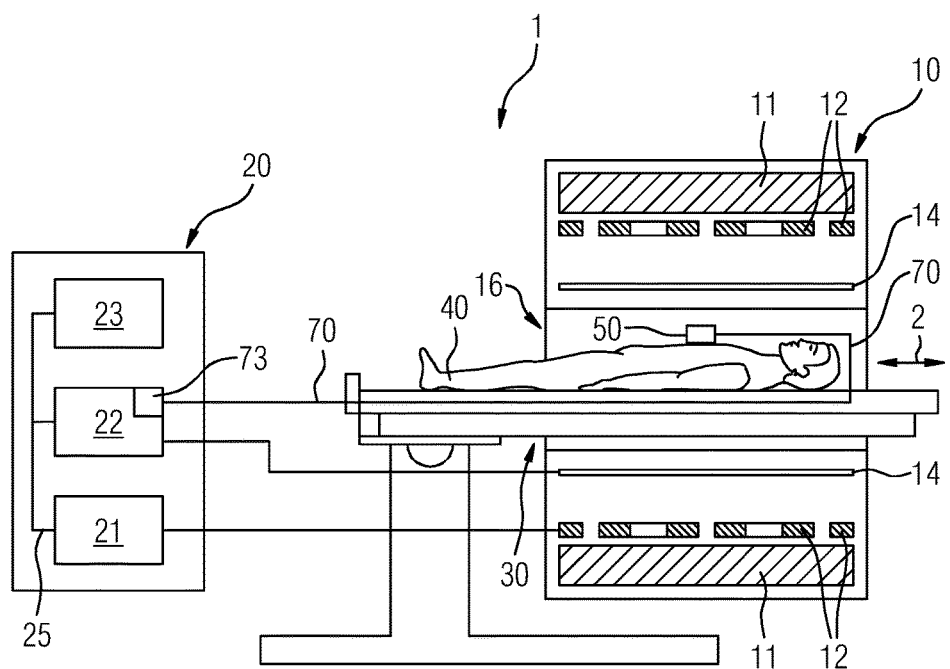
FIG. 1 shows an example of a schematic diagram of one embodiment of a magnetic resonance tomograph.

FIG. 1 shows a schematic diagram of a magnetic resonance tomograph 1 with one embodiment of a transmission apparatus 70.

The magnet unit 10 has a field magnet 11 that creates a static magnetic field BO for aligning nuclear spins of test samples or in a body of a patient 40 in a recording area. The recording area is arranged in a patient tunnel 16 that extends in a longitudinal direction 2 through the magnet unit 10. The field magnet 11 may involve a superconducting magnet that may provide magnetic fields with a magnetic flux density of up to 3 Tesla, or even more with the latest devices. For lower field strengths, however, permanent magnets or electromagnets with normally-conducting coils may be used.

The magnet unit 10 also has gradient coils 12 that, for spatial differentiation of the acquired imaging regions in the examination volume, are configured to superimpose on the magnetic field BO variable magnetic fields in three spatial directions. The gradient coils 12 may be coils made of normally-conducting wires that may generate fields in the examination volume that are orthogonal to one another.

The magnet unit 10 likewise has a body coil 14 configured to irradiate a radio-frequency signal supplied via a signal line into the examination volume and to receive resonance signals emitted by the patient 40 and output the resonance signals via a signal line. The magnetic resonance tomograph of one or more of the present embodiments has one or more local coils 50 that are arranged in the patient tunnel 16 close to the patient 40.

A control unit 20 (e.g., a controller) supplies the magnet unit 10 with the various signals for the gradient coils 12 and the body coil 14 and evaluates the received signals.

Thus, the control unit 20 has a gradient controller 21 configured to supply the gradient coils 12 with variable currents via feed lines that are coordinated in timing to provide the desired gradient fields in the examination volume.

The control unit 20 has a receive unit 22 (e.g., a receiver) configured to create a radio-frequency pulse with a predetermined timing curve, amplitude, and spectral power distribution to excite a magnetic resonance of the nuclear spin in the patient 40. In this case, pulse powers in the Kilowatt range are achieved. The individual units are connected to one another via a signal bus 25.

The local coil 50 may receive a magnetic resonance signal from the body of the patient 40, since because of the short distance involved, the signal-to-noise ratio (SNR) of the local coil 50 is better than receipt of the signal by the body coil 14. The MR signal received by the local coil 50 are prepared in the local coil 50 and forwarded by the transmission apparatus 70 to the receive unit 22 of the magnetic resonance tomograph 1 for evaluation and image acquisition.

Figure 2:
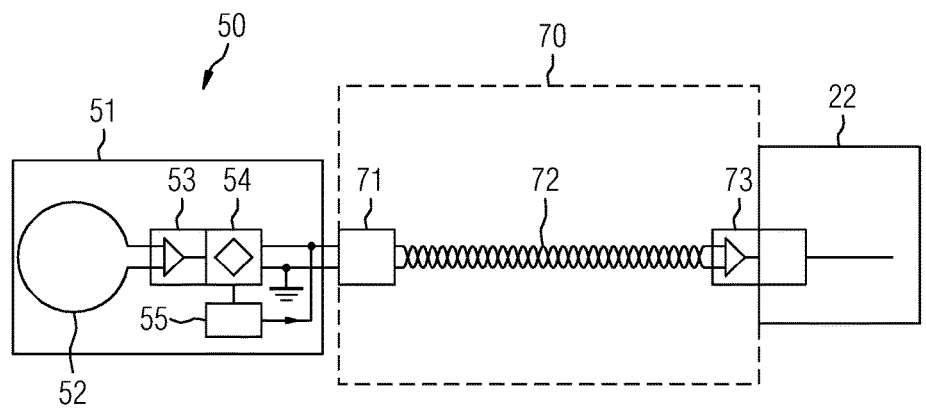
FIG. 2 shows a schematic diagram of one embodiment of a transmission apparatus with a local coil and a receive unit.

FIG. 2 shows schematically an example of a transmission apparatus 70 with the local coil 50 and the receive unit 22. In a housing 51, the local coil 50 has an antenna coil 52 for receiving an MR signal. The received MR signal will subsequently be amplified by a pre-amplifier 53 (e.g., low noise amplifier, LNA). The MR signal lies at the Larmor frequency, which is dependent on the strength of the magnetic field BO and, for 3 Tesla, amounts to around 130 MHz. The bandwidth of the MR signal amounts to around 0.5 MHz. The MR signal will therefore be mixed in a mixer 54 with a signal of an oscillator 55 or an oscillator signal and converted into an intermediate frequency signal for transmission at a lower frequency. The intermediate frequency signal in this case, on account of the simpler signaling technology, may be an asymmetrical signal related to a signal ground.

In one embodiment, the oscillator signal may be created locally, for example, in the local coil 50 by an oscillator 55. In order to be able to re-establish the frequency and the phase relationship of the MR signal during the image acquisition, the oscillator signal may then also be transmitted from the local coil 50 to the receive unit 22 (e.g., via a common line or transmission apparatus 70).

Figure 3:
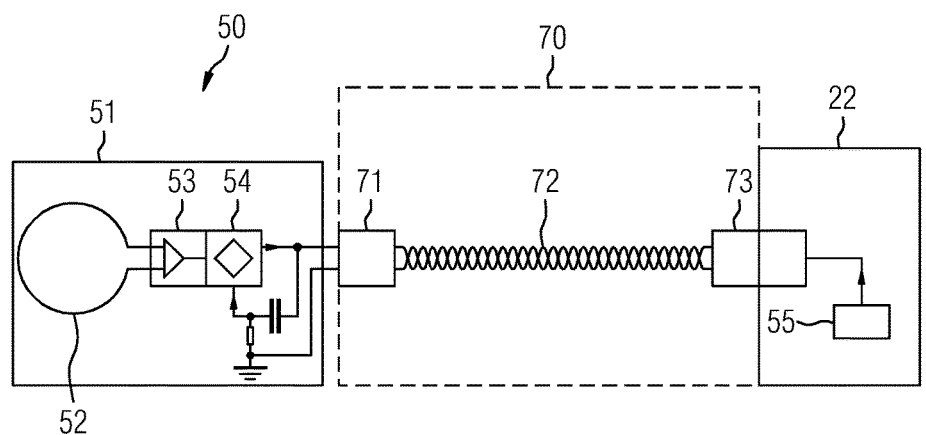
FIG. 3 shows a schematic diagram of one embodiment of a transmission apparatus with a local coil and a receive unit.

If a number of local coils 50 are provided on a magnetic resonance tomograph 1, then in one embodiment, the oscillator 55 may provide the oscillator signal jointly for a number of local coils 50 and the signal may be provided centrally in the receive unit 22. The oscillator signal will then likewise be transmitted by the transmission apparatus 70 between local coil 50 and receive unit 22, but in the other direction. This form of embodiment is shown in FIG. 3, which in other respects is no different from FIG. 2. The separation of the oscillator signal and the intermediate frequency signal may be done, for example, by a high pass/low pass combination (diplexer) in the local coil 50.

The transmission apparatus 70 has a symmetrizing element 71 that converts the asymmetrical intermediate frequency signal with ground relationship into a symmetrical third signal without potential relationship. Modified Boucherot bridges, which are presented below, are suitable for converting the signals with different frequency, for example. Classical baluns with ring core transformers are not suitable, on account of the ferrites used, in the environment of the field magnet 11.

The third signal is transmitted by a symmetrical transmission line 72. A line of this type may be a twisted-pair cable, for example, as is used for LAN cabling (e.g., referred to as CAT4, CAT5 or CAT6) depending on screening and characteristics. Plugs usual in LAN cabling, such as RJ-45, may also be employed. However, other symmetrical lines such as flat webbed lines or strip lines on flexible or rigid circuit board substrates may also be provided. Other plug-in systems are likewise also able to be used.

In one embodiment, the intermediate frequency signal may initially be routed onwards on an asymmetrical transmission line such as coaxial cable or asymmetrical strip lines from the local coil to a transfer point. For example a possible application case may be a spine coil integrated into a patient couch 40, of which the intermediate frequency signals are conveyed to one end of the patient couch 40 by an asymmetrical transmission line on a circuit board substrate and may subsequently be adapted to a third signal by a symmetrizing element 71 for further transmission on a symmetrical transmission line 72. One or more of the present embodiments include all these combinations of asymmetrical and symmetrical transmission lines.

In one embodiment, a conversion of the third symmetrical signal into an asymmetrical signal by a converter 73 again takes place at the end of the symmetrical transmission line 72, since the electronic signal processing in the receive unit 22 is mostly based on ground-related, asymmetrical signals. If the transmission apparatus 70 is transmitting the oscillator signal and the intermediate frequency signal in the same direction, the converter may be realized, for example, by a wideband differential amplifier. A converter 73 with passive components that are realized, for example, as in the symmetrizing element 71 with one or more Boucherot bridges, is suitable for a transmission in both directions.

In accordance with one or more of the present embodiments, the symmetrizing element 71 of the transmission apparatus 70 may also be arranged in the housing 51 of the local coil and/or the converter 73 may be part of the receive unit 22 of the magnetic resonance tomograph 1.

Figure 4:
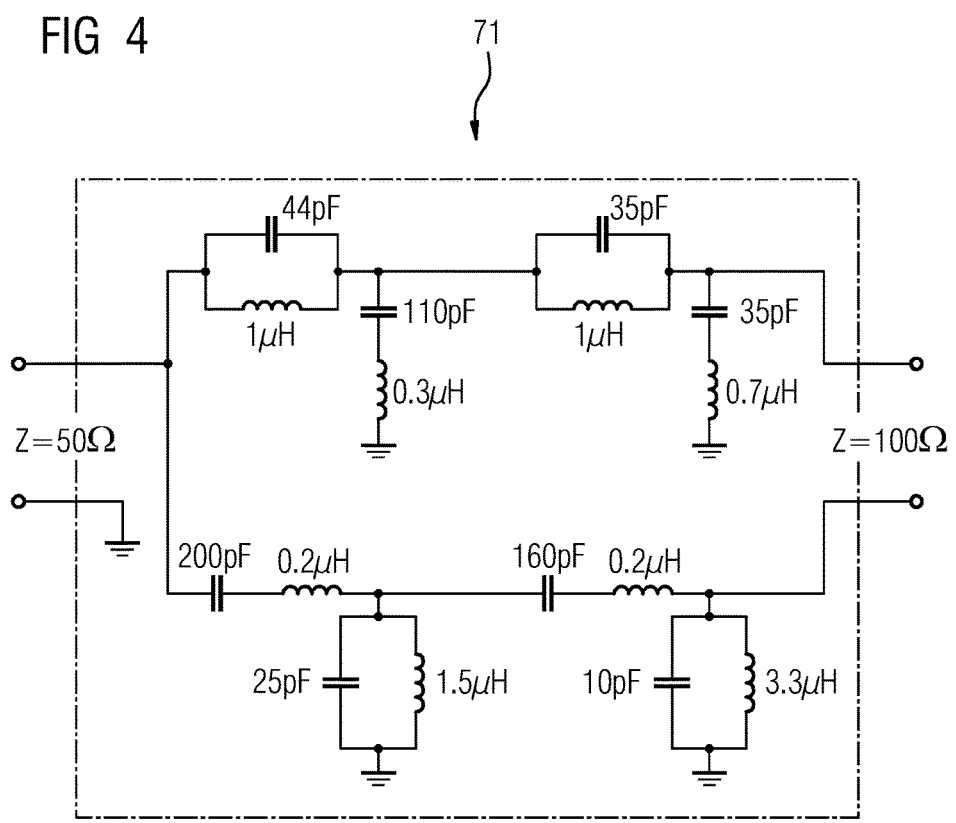
FIG. 4 shows a schematic diagram of an example of a symmetrizing element.

FIG. 4 specifies an example of a schematic diagram of a symmetrizing element 71 of one embodiment of a transmission apparatus.

The symmetrizing element 71, shown by way of example in FIG. 4, performs a conversion from a signal port with asymmetrical signal and an impedance of 50 Ohm on the left-hand side, to a symmetrical signal port with 100 Ohm impedance on the right-hand side. Through the particular design of the symmetrizing element 71 shown, in the form of a "wideband dual-band Boucherot bridge," the desired conversion takes place both in a frequency range of 55 MHz to 75 MHz for the oscillator frequency and also in a frequency range of 8 MHz to 12 MHz for the intermediate frequency signal.

A simplest form of design of a Boucherot bridge has an asymmetrical signal input, to which two branches of the Boucherot bridge will be fed. The branches correspond to the signal paths in the upper or the lower halves of the circuit diagram in FIG. 4. A differential or symmetrical output signal is present at the output of the respective branches through phase shifting in the respective branches in the opposite direction. Because of the passive components, a signal flow in the reverse direction may also be provided in order to convert a symmetrical signal into an asymmetrical signal.

The opposing phase shift may, for example, be achieved by a high pass in one branch and a low pass in the other branch. The high pass and the low pass may also be referred to as Boucherot elements. In FIG. 4, two such stages are connected in series in each branch.

In addition, in the embodiment of FIG. 4, the capacitances in the respective Boucherot elements are each configured as parallel oscillating circuits and the inductances are each configured as a series oscillating circuit. While low pass and high pass each only obtain a phase displacement amounting to a maximum of 90 degrees, oscillating circuits achieve a phase displacement amounting to a maximum of 180 degrees, with 90 degrees at the resonant frequency. Through suitable design of the resonant frequencies, an oscillating circuit may thus act as a low pass at one frequency and as a high pass at another frequency, so that the Boucherot bridge with the oscillating circuits acts as a symmetrizing element for two widely differing frequencies, by changing the effect of the two branches.

A symmetrizing element 71 that, as shown in FIG. 4, is only constructed from passive and ferrite-free components may be used in the vicinity of the field magnet and is suitable for both directions of the signal flow, from the symmetrical to the unsymmetrical signal port and vice versa.

Although the invention has been illustrated and described in greater detail by the exemplary embodiments, the invention is not restricted by the disclosed examples. Other variations may be derived herefrom by the person skilled in the art without departing from the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A transmission apparatus for transmitting an intermediate frequency signal and an oscillator signal for mixing down of the intermediate frequency signal, the transmission apparatus comprising:
   a symmetrical transmission line for transmission of the oscillator signal and the intermediate frequency signal; and
   a symmetrizing element configured to adapt an unsymmetrical signal source, a signal sink, or the unsymmetrical signal source and the signal sink to the symmetrical transmission line,
   wherein the symmetrizing element has only ferrite-free inductances, and
   wherein the transmission apparatus has a local attenuation minimum in a frequency range of the oscillator signal and in a frequency range of the intermediate frequency signal, respectively.

2. The transmission apparatus of claim 1, wherein the oscillator signal has a frequency greater than 50 MHz, and the intermediate frequency signal has a frequency less than 20 MHz.

3. The transmission apparatus of claim 1, wherein the transmission apparatus has a local maximum of a common mode rejection in a frequency range of the oscillator signal and in a frequency range of the intermediate frequency signal, respectively.

4. The transmission apparatus of claim 1, wherein the symmetrizing element includes a Boucherot bridge.

5. The transmission apparatus of claim 4, wherein the Boucherot bridge, in at least one branch of the Boucherot bridge, has two stages.

6. The transmission apparatus of claim 4, wherein each capacitance of one or more capacitances of the Boucherot bridge is replaced by a respective parallel oscillating circuit, each inductance of one or more inductances of the Boucherot bridge is replaced by a respective series oscillating circuit, or a combination thereof.

7. The transmission apparatus of claim 5, wherein each capacitance of one or more capacitances of the Boucherot bridge is replaced by a respective parallel oscillating circuit, each inductance of one or more inductances of the Boucherot bridge is replaced by a respective series oscillating circuit, or a combination thereof.

8. A magnetic resonance tomograph comprising:
   a transmission apparatus for transmitting an intermediate frequency signal and an oscillator signal for mixing down of the intermediate frequency signal, the transmission apparatus comprising:
      a symmetrical transmission line for transmission of the oscillator signal and the intermediate frequency signal; and
      a symmetrizing element configured to adapt an unsymmetrical signal source, a signal sink, or the unsymmetrical signal source and the signal sink to the symmetrical transmission line, wherein the symmetrizing element has only ferrite-free inductances;
   a local coil; and
   a receiver,
   wherein the local coil is connected for signaling to the receiver by the transmission apparatus for transmission of magnetic resonance signals, and
   wherein the transmission apparatus has a local attenuation minimum in a frequency range of the oscillator signal and in a frequency range of the intermediate frequency signal, respectively.

9. The magnetic resonance tomograph of claim 8, wherein the local coil is connected to the transmission apparatus for signaling via an asymmetrical interface.

10. The magnetic resonance tomograph of claim 8, wherein the oscillator signal has a frequency greater than 50 MHz.

11. The magnetic resonance tomograph of claim 8, wherein the transmission apparatus has a local maximum of a common mode rejection in a frequency range of the oscillator signal and in a frequency range of the intermediate frequency signal, respectively.

12. The magnetic resonance tomograph of claim 8, wherein the symmetrizing element includes a Boucherot bridge.

13. The magnetic resonance tomograph of claim 12, wherein the Boucherot bridge, in at least one branch of the Boucherot bridge, has two stages.

14. The magnetic resonance tomograph of claim 12, wherein each capacitance of one or more capacitances of the Boucherot bridge is replaced by a respective parallel oscillating circuit, each inductance of one or more inductances of the Boucherot bridge is replaced by a respective series oscillating circuit, or a combination thereof.

15. The magnetic resonance tomograph of claim 13, wherein each capacitance of one or more capacitances of the Boucherot bridge is replaced by a respective parallel oscillating circuit, each inductance of one or more inductances of the Boucherot bridge is replaced by a respective series oscillating circuit, or a combination thereof.

16. A transmission apparatus for transmitting an intermediate frequency signal and an oscillator signal for mixing down of the intermediate frequency signal, the transmission apparatus comprising:

a symmetrical transmission line for transmission of the oscillator signal and the intermediate frequency signal; and a symmetrizing element configured to adapt an unsymmetrical signal source, a signal sink, or the unsymmetrical signal source and the signal sink to the symmetrical transmission line, wherein the symmetrizing element has only ferrite-free inductances, and wherein the transmission apparatus has a local maximum of a common mode rejection in a frequency range of the oscillator signal and in a frequency range of the intermediate frequency signal, respectively.

* * * * *